(12) United States Patent
Su et al.

(10) Patent No.: US 10,743,402 B2
(45) Date of Patent: Aug. 11, 2020

(54) SINGLE PLATE HEAT RADIATION DEVICE AND METHOD

(71) Applicant: ZTE Corporation, Shenzhen (CN)

(72) Inventors: Zhan Su, Shenzhen (CN); Xianfeng Xiong, Shenzhen (CN); Fenghua Liu, Shenzhen (CN); Jun Yan, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 211 days.

(21) Appl. No.: 15/575,582

(22) PCT Filed: Feb. 25, 2016

(86) PCT No.: PCT/CN2016/074580
§ 371 (c)(1),
(2) Date: Nov. 20, 2017

(87) PCT Pub. No.: WO2016/188162
PCT Pub. Date: Dec. 1, 2016

(65) Prior Publication Data
US 2018/0160522 A1 Jun. 7, 2018

(30) Foreign Application Priority Data

May 22, 2015 (CN) .......................... 2015 1 0267749

(51) Int. Cl.
*H05K 1/02* (2006.01)
*H05K 7/20* (2006.01)
*H04B 10/40* (2013.01)

(52) U.S. Cl.
CPC ......... *H05K 1/0203* (2013.01); *H05K 1/0216* (2013.01); *H05K 7/20* (2013.01);
(Continued)

(58) Field of Classification Search
CPC .......... H05K 1/203; H05K 1/216; H05K 7/20; H05K 7/20545; H05K 7/20563
(Continued)

(56) References Cited

U.S. PATENT DOCUMENTS 5,559,675 A * 9/1996 Hsieh ...................... G06F 1/203
174/16.3
5,949,648 A 9/1999 Liao
(Continued)

FOREIGN PATENT DOCUMENTS

CN 200997742 Y 12/2007
CN 101384158 A 3/2009
(Continued)

OTHER PUBLICATIONS

International Search Report in international application No. PCT/CN2016/074580, dated May 24, 2016, 2 pgs.
(Continued)

*Primary Examiner* — Joel M Attey
(74) *Attorney, Agent, or Firm* — Cooper Legal Group, LLC

(57) ABSTRACT

Disclosed are a single plate heat radiation device and a method, and the device includes: a single plate heat radiator, a single plate, a first shielding plate having a panel portion, and a second shielding plate configured for heat radiating. A boss is provided on the second shielding plate. The boss is connected to the single plate radiator through an opening in the single plate and is configured for conducting the heat collected from the single plate by the single plate radiator to the second shielding plate. By means of the present invention, the problem of poor heat radiating effect in the related technology, caused by limited heat radiating area for convective heat radiating and limited heat radiating path for conductive heat radiating, is solved, and thereby the effects (Continued)

of increased heat radiating area and increased heat radiating path are achieved.

9 Claims, 8 Drawing Sheets

(52) U.S. Cl.
CPC ..... *H05K 7/20545* (2013.01); *H05K 7/20563* (2013.01); *H04B 10/40* (2013.01)

(58) Field of Classification Search
USPC .......................................... 165/80.3, 104.33
See application file for complete search history.

(56) References Cited

U.S. PATENT DOCUMENTS

| | | | | |
|---|---|---|---|---|
| 7,623,348 | B2* | 11/2009 | Otsuki | H01L 23/3672 165/121 |
| 7,894,183 | B2* | 2/2011 | Chen | G06F 1/203 165/80.3 |
| 8,456,842 | B2 | 6/2013 | Li | |
| 2002/0135990 | A1* | 9/2002 | Hattori | H05K 7/1461 361/801 |
| 2005/0086677 | A1* | 4/2005 | Ochi | G11B 7/082 720/659 |
| 2005/0141200 | A1* | 6/2005 | Campini | H01L 23/3677 361/704 |
| 2005/0152117 | A1* | 7/2005 | Belady | H01L 23/36 361/704 |
| 2007/0148816 | A1* | 6/2007 | Davis, Jr. | H05K 3/341 438/106 |
| 2009/0057004 | A1 | 3/2009 | Watanabe | |
| 2010/0039767 | A1* | 2/2010 | Katada | F28F 3/12 361/679.53 |
| 2012/0155031 | A1 | 6/2012 | Li | |
| 2017/0156201 | A1* | 6/2017 | Nakayama | B32B 7/02 |
| 2018/0160522 | A1 | 6/2018 | Su et al. | |

FOREIGN PATENT DOCUMENTS

| | | |
|---|---|---|
| CN | 201479458 U | 5/2010 |
| CN | 102281740 A | 12/2011 |
| CN | 102573345 A | 7/2012 |
| CN | 202713882 U | 1/2013 |
| CN | 202839585 U | 3/2013 |
| CN | 203353033 U | 12/2013 |
| CN | 103687447 A | 3/2014 |
| CN | 103857266 A | 6/2014 |
| CN | 104219928 A | 12/2014 |
| JP | 2003218570 A | 7/2003 |

OTHER PUBLICATIONS

English Translation of the Written Opinion of the International Search Authority in international application No. PCT/CN2016/074580, dated May 24, 2016, 6 pgs.

Supplementary European Search Report in European application No. 16799051.4, dated May 11, 2016, 9 pgs.

* cited by examiner

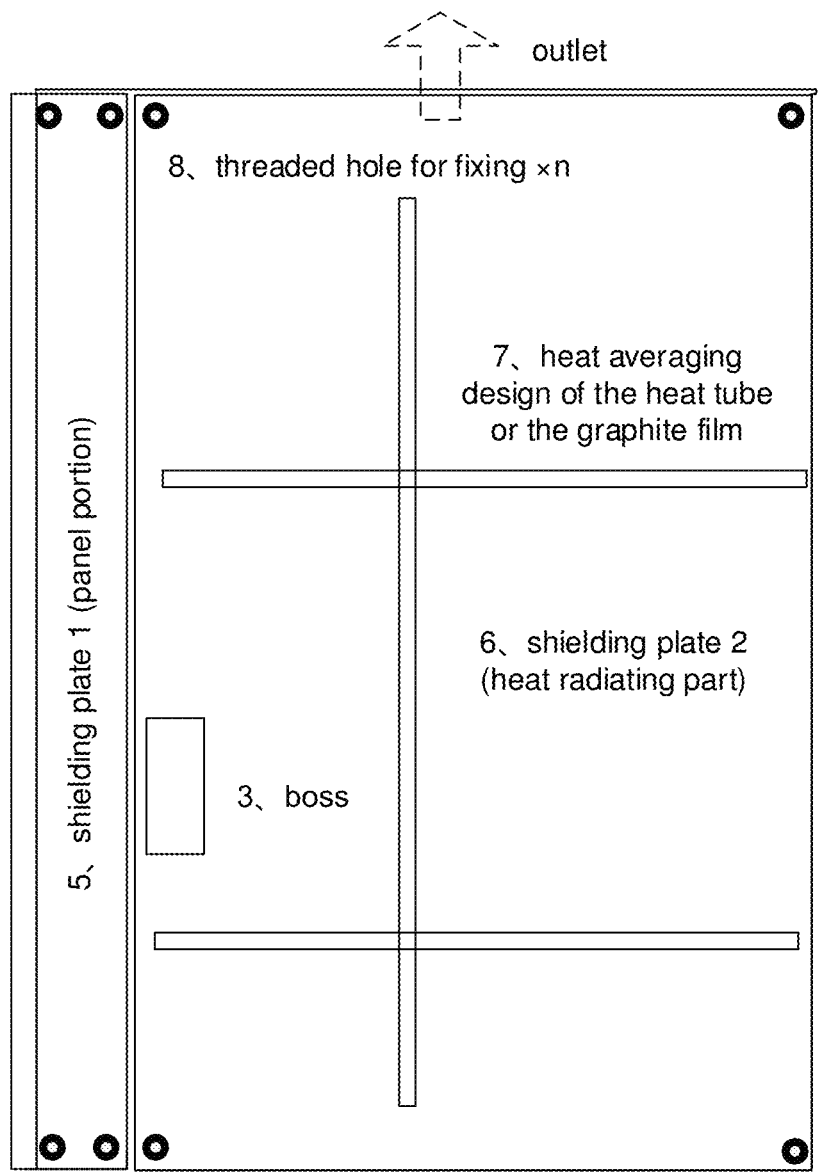
FIG. 5b top view of shielding plate

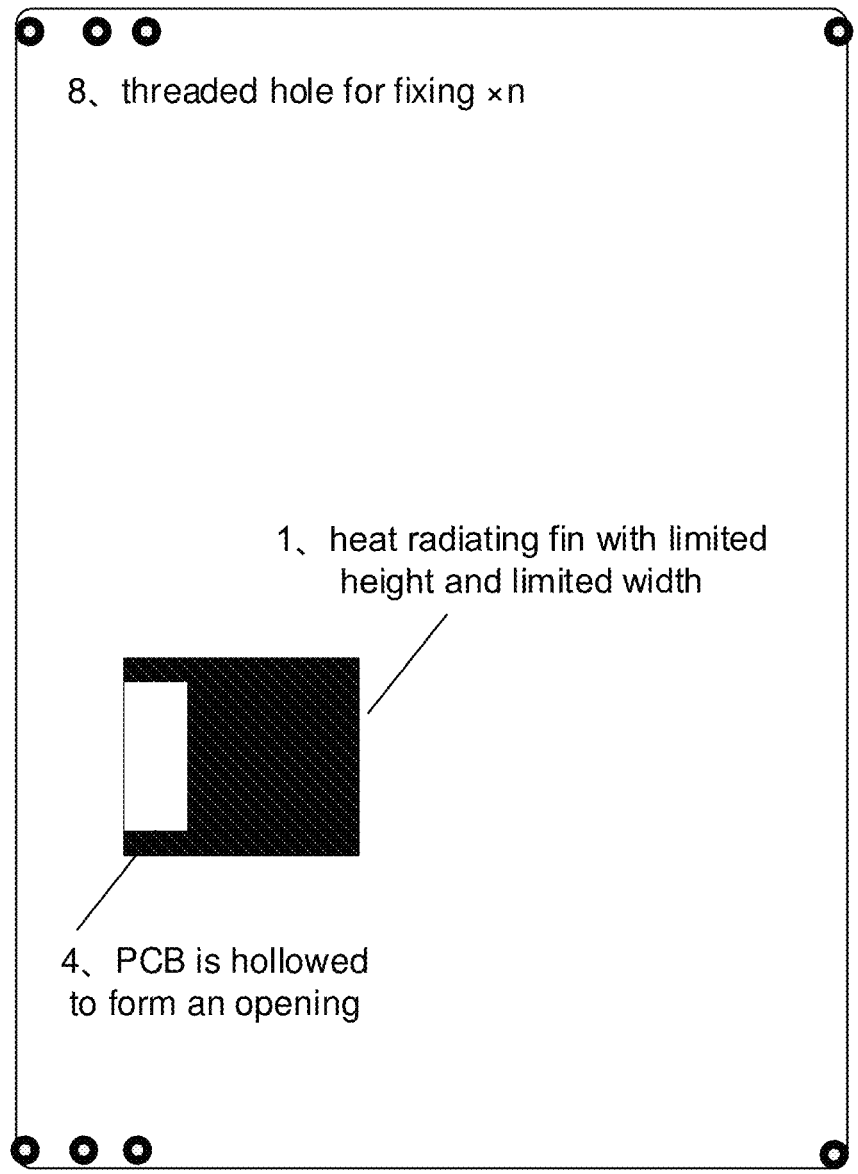
FIG. 5c top view of PCB

SINGLE PLATE HEAT RADIATION DEVICE AND METHOD

TECHNICAL FIELD

The present invention relates to the field of communications, and more particularly to a heat radiating device and a heat radiating method for a single board.

BACKGROUND

Form 10G to 40G, even to 100G, with the development of optical Moore's law technology, integration is a trend. The power consumption of some main service processing chips and optical-electric modules is increasing day by day, and the port density and power consumption of a single board is increasing, but a conductive heat radiating area and a convective heat radiating area of a core component are getting more and more limited. FIG. 1 is a frontal section view of a communication sub-frame and a single board in the related art; as shown in FIG. 1, electronic components and optical-electric modules with high power consumption on the single board are heat sources. A heat radiating path is from the heat sources such as the components with power consumption to a heat radiating medium, and then to a heat radiating fin; finally, the heat is removed by air passing through air ducts of radiating teeth in the heat radiating fin.

With the development of technology, the objective is to realize more intersections of single sub-frame and service capacity, that is to say, to bear service single boards as more as possible and improve the competitiveness of industry. The heat design of a traditional single board is required and limited by a single slot and a width of the single slot, which causes an inherent limitation to a height of the heat radiating fin. Radiators, close to a chip with high power consumption requiring heat radiation, on the single board interfere with each other, which causes a limit to the length and width of a part of radiators. Therefore, an equivalent radiating area of the radiating tooth of the component with problems is seriously limited, which causes a convective heat radiating path (as shown by a diagonal stripe arrow in FIG. 1) to be unable to satisfy requirements on the heat design of a system.

When a radiating area of the heat radiating fin of a certain component with high power consumption is limited to be unable to satisfy the requirement, a heat resistance of a direct heat radiating path of the component is slightly higher, the heat of the heat sources cannot be effectively removed by convective air, and part of the heat will be conducted to a single-board Printed Circuit Board (PCB) from a pin of the component as the heat source, a solder ball, a radiating pad or other surfaces contacting the PCB, and other radiation paths (as shown by horizontal stripe arrows 1-4 in FIG. 1). The PCB does not have an effective heat radiating path except inner cooper foil, so that the accumulation of heat of the PCB will raise its temperature. Moreover, the power consumption of a part of components is different and not evenly distributed, and the heat of the PCB will flow back to other components, thereby impacting the components (as shown by a horizontal stripe arrow 5 in FIG. 1).

Accordingly, in the related art, there is a problem of poor heat radiating effect caused by a limited heat radiating area for convective heat radiation and a limited heat radiating path for conductive heat radiation.

SUMMARY

The present invention provides a heat radiating device and a heat radiating method for a single board, to at least solve the problem of poor heat radiating effect in the related art, caused by a limited heat radiating area during convective heat radiation and a limited heat radiating path during conductive heat radiation.

According to an aspect of the present invention, a heat radiating device for a single board is provided, which includes: a single board radiator (1), a single board (9), a first shielding plate (5) having a panel portion, and a second shielding plate (6) configured for heat radiation; wherein a boss (3) is provided on the second shielding plate (6); the boss (3) is connected to the single board radiator (1) through an opening (4) in the single board (9), and is configured to conduct heat collected from the single board (9) by the single board radiator (1) to the second shielding plate (6).

Alternatively, the boss (3) may be connected with the single board radiator (1) through a heat-conducting component (2).

Alternatively, the heat-conducting component (2) may include heat-conducting rubber gasket or silicone grease with a heat conduction coefficient higher than 5.

Alternatively, a heat averaging medium (7) may be set on the second shielding plate (6); the heat averaging medium (7) may be configured to diffuse the heat, which is conducted to the second shielding plate (6) through the boss (3), to the whole second shielding plate (6).

Alternatively, the first shielding plate (5) and the second shielding plate (6) may be fixedly connected to the single board (9) through a screw hole (8) for fixing, respectively.

Alternatively, the second shielding plate (6) may be structurally or electrically isolated from the first shielding plate (5) which is set as electromagnetic shielding.

Alternatively, a solder mask copper area with a heat radiating hole on a back of the single board (9) and the second shielding plate (6) may be interconnected through heat-conducting rubber gasket or silicone grease.

According to another aspect of the present invention, a heat radiating method for a single board is provided, which includes that: the single board radiator (1) collects heat radiated from the single board (9); the boss (3) set on the second shielding plate (6) conducts the heat collected by the single board radiator (1) to the second shielding plate (6), wherein the second shielding plate (6) is isolated from the first shielding plate (5) having a panel portion, and the boss (3) is connected to the single board radiator (1) through the opening (4) in the single board (9).

Alternatively, the boss (3) may conduct the heat collected by the single board radiator (1) to the second shielding plate (6) through the heat-conducting component (2), wherein the heat-conducting component (2) may include the heat-conducting rubber gasket or silicone grease with the heat conduction coefficient higher than 5.

Alternatively, the heat averaging medium (7) set on the second shielding plate (6) may diffuse the heat conducted to the second shielding plate (6) through the boss (3) to the whole second shielding plate (6).

Alternatively, the heat, which is radiated from the heat radiating hole on a back of the single board (9), may be conducted to the second shielding plate (6) in a manner of interconnecting the solder mask copper area with the heat radiating hole on the back of the single board (9) and the second shielding plate (6) through heat-conducting rubber gasket or silicone grease.

According to the present invention, the single board radiator (1), the single board (9), the first shielding plate (5) having a panel portion, and the second shielding plate (6) configured for heat radiation are adopted, wherein the boss (3) is set on the second shielding plate (6), and the boss (3)

is connected to the single board radiator (1) through the opening (4) in the single board (9), and is configured to conduct the heat collected from the single board by the single board radiator (1) to the second shielding plate (6); as such, the problem of poor heat radiating effect in the related art, caused by a limited heat radiating area during convective heat radiation and a limited heat radiating path during conductive heat radiation, is solved, thereby achieving the effects of increased heat radiating area and increased heat radiating path.

BRIEF DESCRIPTION OF DRAWINGS

The accompanying drawings described here are used for providing a deeper understanding of the present invention, and constitute a part of the application; schematic embodiments of the present invention and description thereof are used for illustrating the present invention and not intended to form an improper limit to the present invention. In the accompanying drawings.

DETAILED DESCRIPTION

The present invention is elaborated below in combination with the accompanying drawings and embodiments. Please be noted that, the embodiments in the application and the features in the embodiments can be combined with each other on the condition of no conflict.

Figure 1:
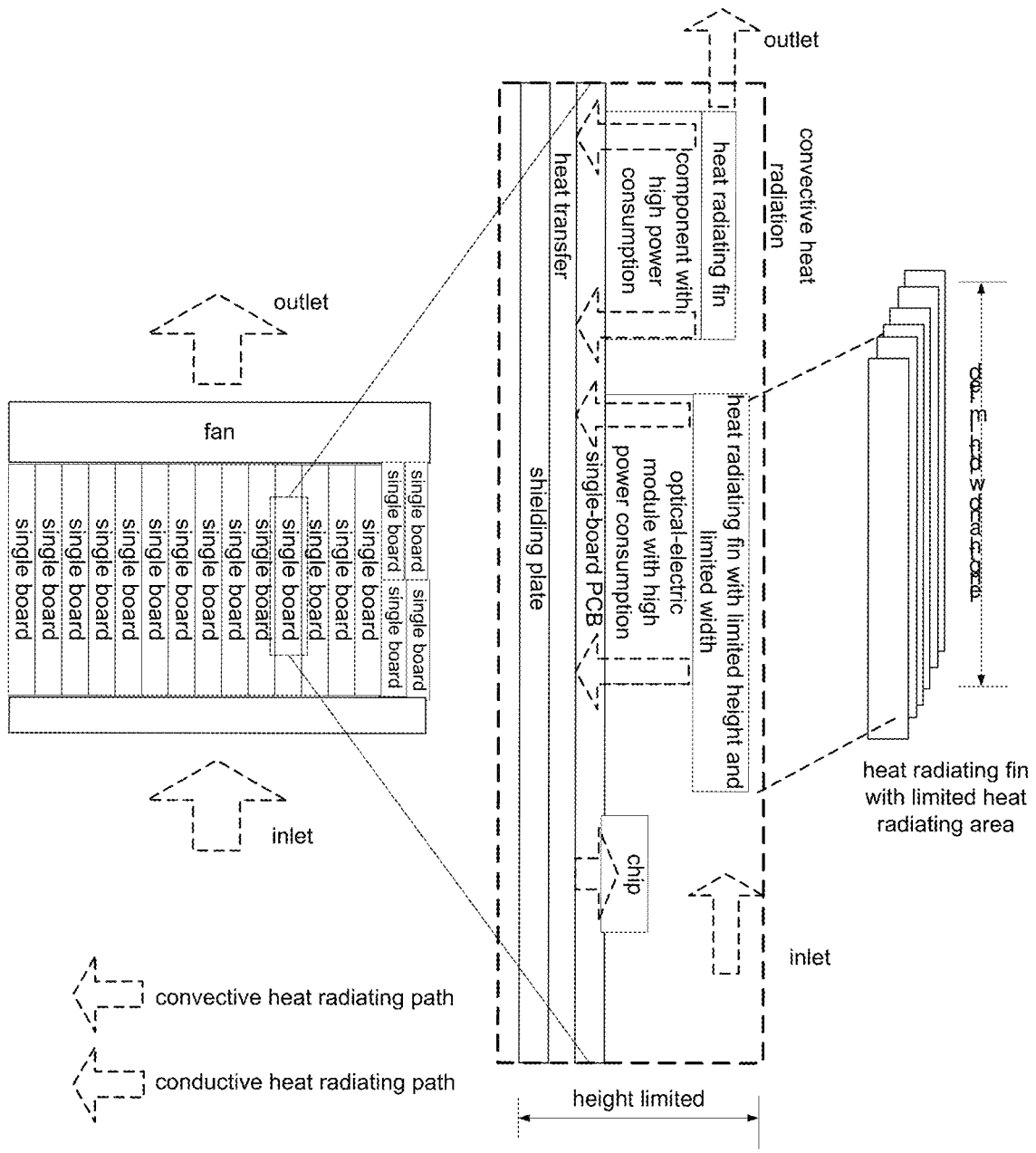
FIG. 1 is a frontal section view of a communication sub-frame and a single board in the related art.
Figure 2:
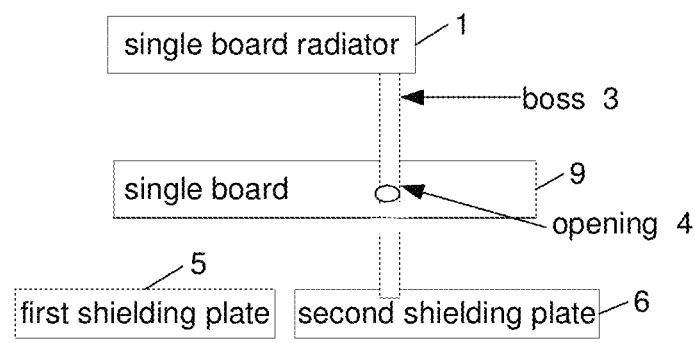
FIG. 2 is a structure diagram of a heat radiating device for a single board according to an embodiment of the present invention.

In an embodiment, a heat radiating device for a single board is provided. FIG. 2 is a structure diagram of a heat radiating device for a single board according to an embodiment of the present invention. As shown in FIG. 2, the heat radiating device for a single board includes: a single board radiator 1, a single board 9, a first shielding plate 5 having a panel portion, and a second shielding plate 6 configured for heat radiation; wherein a boss 3 is set on the second shielding plate 6; the boss 3 is connected to the single board radiator 1 through an opening 4 in the single board 9, and is configured to conduct heat collected from the single board 9 by the single board radiator 1 to the second shielding plate 6.

Through the above structure, an original metal shielding plate only serving as mechanical support and electromagnetic shielding is divided into two parts: one part is the first shielding plate 5 having the panel portion, and the other part is the second shielding plate 6 configured for heat radiation; the heat radiated from the single board radiator 1 is conducted to the back of the single board through the boss 3, that is to say, the heat radiated from the single board radiator 1 is conducted to the second shielding plate 6, and then radiated through the second shielding plate, which increases a heat radiating area and heat radiating path, thereby greatly improving heat radiation efficiency.

In order to improve the heat radiation efficiency, and then improve efficiency of heat conduction between the single board radiator 1 and the boss 3, a heat-conducting component 2 may be set between the boss 3 and the single board radiator, so that the boss 3 is connected to the single board radiator 1 through the heat-conducting component 2. In order to further improve the heat radiation efficiency, the heat-conducting component 2 may be made of a heat-conducting material with a higher heat-conducting efficiency, for example, a heat-conducting rubber gasket or silicone grease with a heat conduction coefficient higher than 5.

After the boss 3 conducts the heat collected by the single board radiator 1 to the second shielding plate, if heat radiation is performed only by using a conduction point conducting the heat, the heat radiation efficiency is very low. Alternatively, a heat averaging medium 7 may be set on the second shielding plate 6; the heat averaging medium 7 is configured to fast diffuse the heat, which is conducted to the second shielding plate 6 through the boss 3, to the whole second shielding plate 6.

The second shielding plate 6 may be connected to the single board 9 in a variety of ways. Alternatively, the second shielding plate 6 may be fixedly connected to the single board 9 through a screw hole 8 for fixing. Note that, the second shielding plate 6 is structurally or electrically isolated from the first shielding plate 5 which is set as electromagnetic shielding; that is to say, the first shielding plate 5 and the second shielding plate 6 are two structurally and electrically separate parts.

While the boss 3 is adopted to perform heat radiation for the single board 9, many other ways can be adopted to perform heat radiation for the single board, that is to say, it is feasible to adopt the processing in many ways combined to maximize the heat radiation efficiency. For example, alternatively, a solder mask copper area with a heat radiating hole on the back of the single board 9 and the second shielding plate 6 may be interconnected through the heat-conducting rubber gasket or silicone grease.

Figure 3:
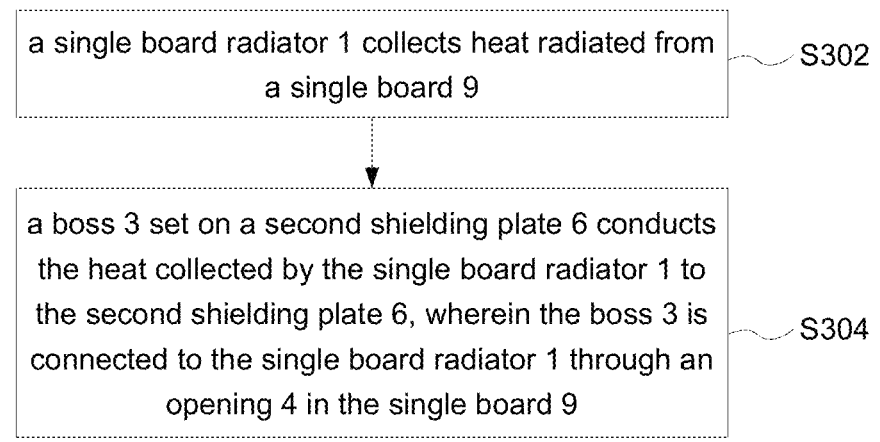
FIG. 3 is a flow chart of a heat radiating method for a single board according to an embodiment of the present invention.

In an embodiment, a heat radiating method for a single board is also provided. FIG. 3 is a flow chart of a heat radiating method for a single board according to an embodiment of the present invention. As shown in FIG. 3, the flow includes the following steps:

Step S302: a single board radiator 1 collects heat radiated from a single board 9; and Step S304: a boss 3 set on a second shielding plate 6 conducts the heat collected by the single board radiator 1 to the second shielding plate 6, wherein the boss 3 is connected to the single board radiator 1 through an opening 4 in the single board 9.

Through the above flow, the heat radiated from the single board radiator 1 is conducted to the back of the single board through the boss 3, which increases the heat radiating area and heat radiating path, thereby greatly improving heat radiation efficiency.

Alternatively, the boss 3 may conduct the heat collected by the single board radiator 1 to the second shielding plate 6 through a heat-conducting component 2, wherein the heat-conducting component 2 includes the heat-conducting rubber gasket or silicone grease with a heat conduction coefficient higher than 5.

Alternatively, a heat averaging medium 7 set on the second shielding plate 6 diffuses the heat conducted to the second shielding plate 6 through the boss 3 to the whole second shielding plate 6.

Preferably, the heat, which is radiated from the heat radiating hole on the back of the single board 9, may be conducted to the second shielding plate 6 in a manner of interconnecting the solder mask copper area with the heat radiating hole on the back of the single board 9 and the second shielding plate 6 through the heat-conducting rubber gasket or silicone grease.

Based on the introduction of the above related art, the key factors about growing heat radiation pressure of the single board with high integration and high power consumption in the related art include: the lack of an effective convective heat radiating area and uneven heat radiation. The problems of heat radiation of the single board in the related art are increasingly serious; which at least includes: (1) there is lack of an effective heat radiating area, and the requirement on heat radiation of the single board with higher power consumption cannot be satisfied; (2) the heat radiation is uneven, and the heat radiated cannot be transferred to the PCB through a pin, which influences other core components; (3) it is not conducive for further miniaturization of the single board.

Figure 4:
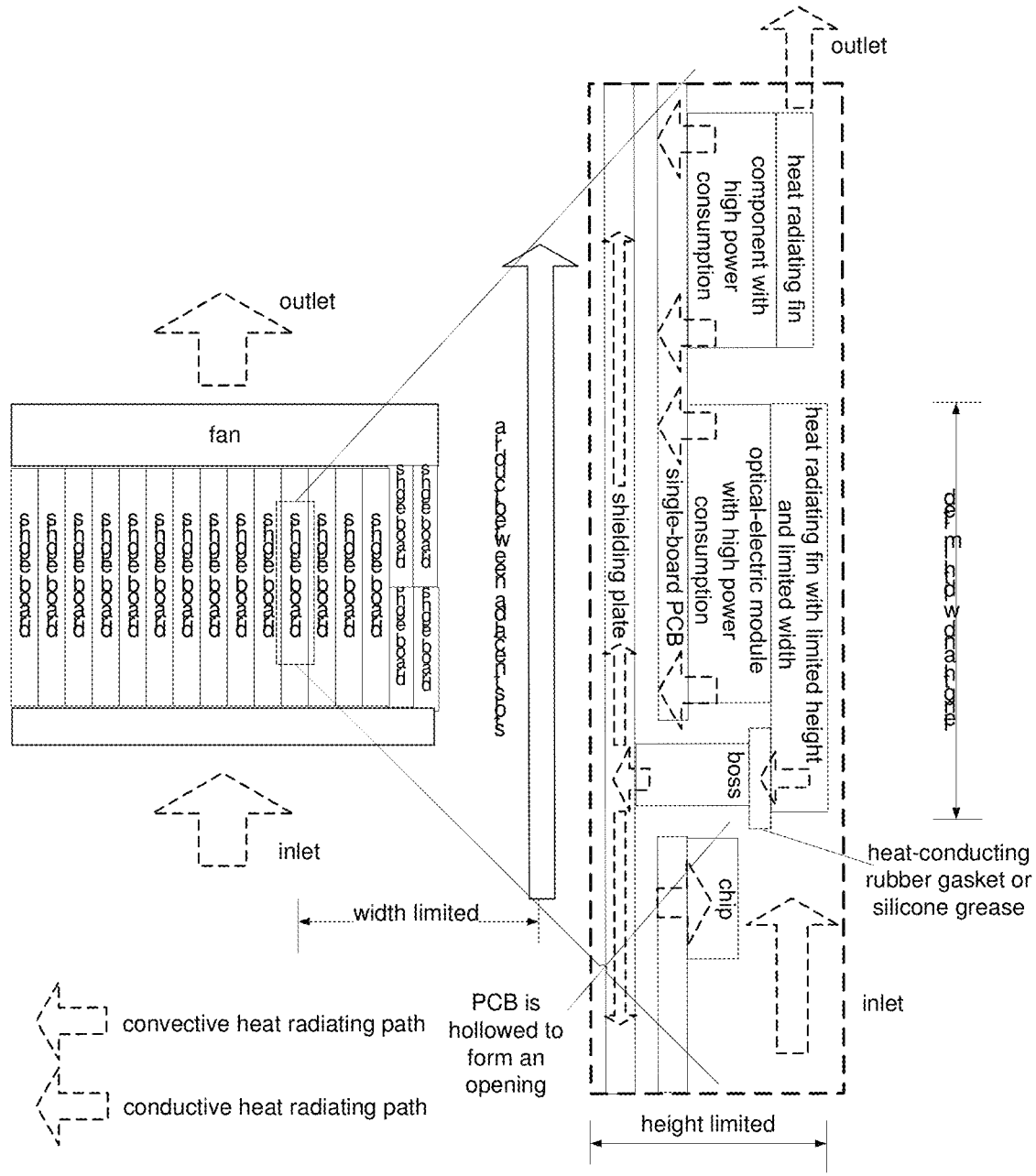
FIG. 4 is a frontal section view of a communication sub-frame and a single board using a shielding plate for heat radiation according to an embodiment of the present invention.

Aiming at the traditional shielding plate which is set as electromagnetic shielding and isolating air duct (avoiding turbulence), in an embodiment, a design of a heat radiating method based on the shielding plate is provided. FIG. 4 is a frontal section view of a communication sub-frame and a single board using a shielding plate for heat radiation according to an embodiment of the present invention. As shown in FIG. 4, the heat of modules with high power consumption and components with high power consumption on the single board can be conducted to the shielding plate with a special heat radiating/heat radiation design on the back through the boss passing through the PCB board. As such, an original metal shielding plate only serving as mechanical support and electromagnetic shielding is designed to be a heat radiating plate, which increases the original heat radiating area in the air duct additionally. A path with low heat resistance from an area with heat radiating problem to a convective heat exchange area is formed, which can decrease the normal working temperature of the core components on the single board. The heat of the shielding plate can be transferred to a chassis from a guide rail and a holder. The problem of heat conduction and heat radiation of the components with high power consumption on the single board is solved by means of an extra heat radiating area of the matched shielding plate of the single board structure in the communication sub-frame.

Note that, the above heat radiating design is mainly applied to solving the heat radiating/heat radiation problem of the single board in an optical fiber communication system. The heat radiating design not only can be applied to the heat radiation of an optical module with high power consumption on the single board at a circuit side with a rate level of 100 Gbps at this stage, but also can be applied to the concentrated heat radiation of a Dual-Carrier Dual-Polarization 16 Quadrature Amplitude Modulation (DC-DP-16QAM) optical transceiver module at a circuit side with a rate level of 400 Gbps, or a multi-path parallel photonic integrated optical module represented by 400 GbE or 4×100G CFP4 or 16×25G CDFP on the corresponding single board in future.

The main characteristics of the heat radiating design of the single board in the communication sub-frame are as follows: firstly, the heat of the single board radiator of which heat radiating space is limited conducted to the metal shielding plate with the special heat radiating design on the back through the boss; secondly, the traditional complete shielding plate is divided into two separate parts: a panel portion and a heat radiating tray, which are respectively fixed with the single board, to completely isolate a protection ground and a working ground of both the optical module and the single board, thereby perfectly solving the problem of connection between the working ground and the protection ground of the system, and undergoing a lighting stroke and electrostatic experiment successfully; thirdly, the shielding plate utilizes a heat tube or a graphite film as the heat radiating design of heat average. By means of the above three characteristics, an electromagnetic shielding device and a heat radiating technology are combined perfectly.

In order to achieve the above characteristics and objectives, the technical solution includes the following processing: (1) in terms of a mechanical structure and PCB design, the PCB is reasonably hollowed in part near the components or modules with high power consumption; a heat-conducting boss with the same shape is set on the shielding plate; through the hollowed opening of the PCB, the top of the boss and the heat radiating fin of the component or the module are tight connected by means of the effective heat-conducting rubber gasket, so that heat conduction from heat radiating component with the heat radiating problem on the front of the PCB to the shielding plate on the back of the PCB is realized; (2) on an electrical and reliability design, the shielding plate is divided into a shielding plate 1 including the panel portion and a shielding plate 2, in this way, under the lighting stroke and electrostatic experiment condition, a high voltage will not influence the working ground of the component or the optical module through the boss of the shielding plate; and the two shielding plates are fixed to the PCB through the threaded hole; (3) on the heat radiating design, the material of the traditional shielding plate is changed, the thickness of the shielding plate is increased, and a heat averaging design of the heat tube or the graphite film is added according to a heat simulation result of the PCB, thereby ensuring even heat radiation on the surface of the shielding plate for heat radiation, dissipating the heat better, and playing an auxiliary role in heat averaging of the PCB.

Figure 5:
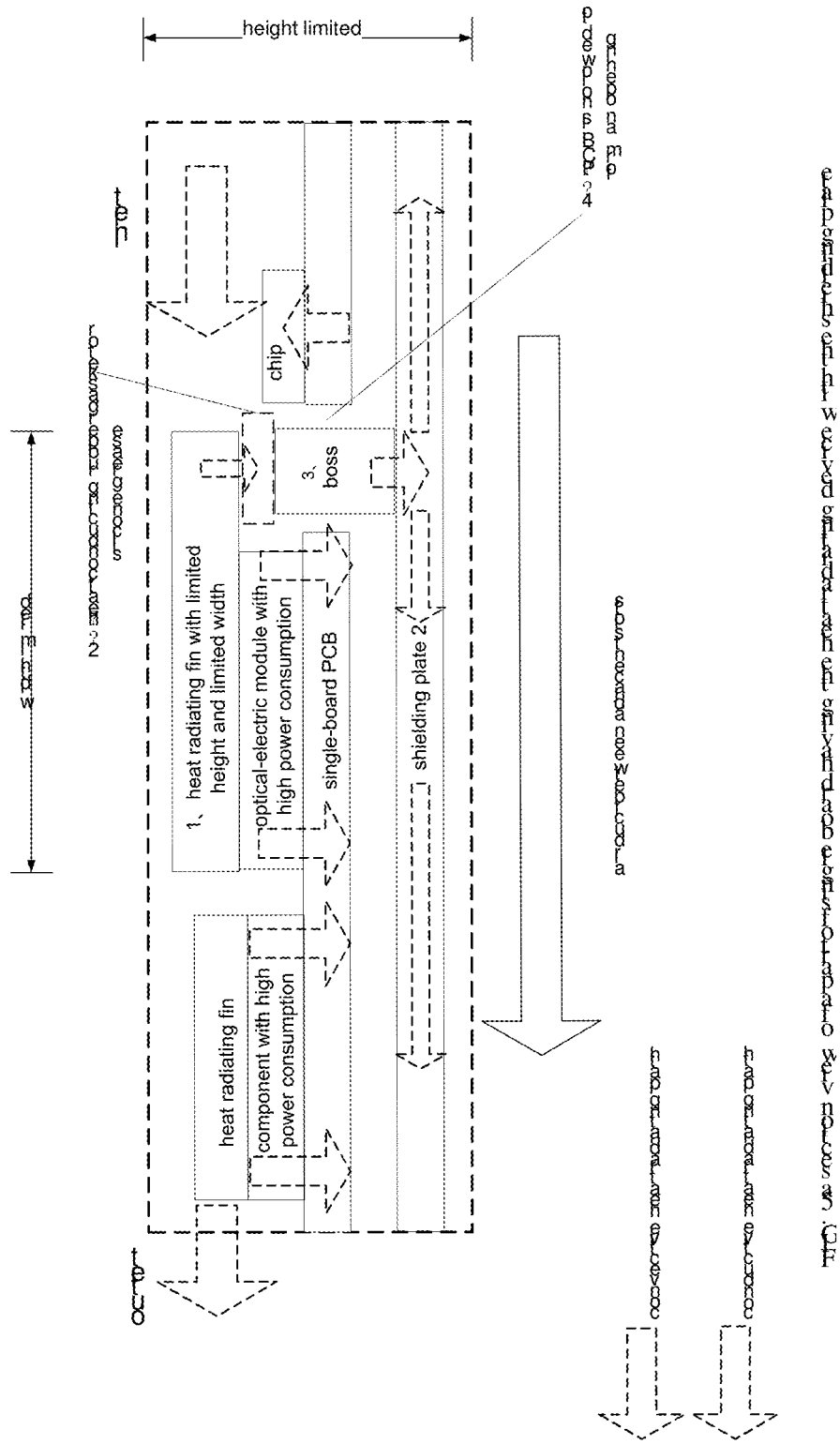
FIG. 5 is an architecture diagram of a heat radiating device with a shielding plate according to an embodiment of the present invention.

FIG. 5 is an architecture diagram of a heat radiating device with a shielding plate according to an embodiment of the present invention. As shown in FIG. 5, the architecture includes three figures a, b, and c; the heat radiating device with a shielding plate includes: the heat radiating fin with limited height and limited width 1 (namely the above-mentioned single board radiator 1), the effective heat-conducting rubber gasket or silicone grease 2 (namely the above-mentioned heat-conducting component 2), the boss 3, the hollowed opening of PCB 4 (namely the above-mentioned opening 4 on the single board 9), the shielding plate 1 (the panel portion) 5 (namely the above-mentioned first shielding plate 5), the shielding plate 2 (the heat radiating part) 6 (namely the above-mentioned second shielding plate 6), the heat averaging design 7 of the heat tube or the graphite film or the like (namely the above-mentioned heat averaging medium 7), the threaded hole 8 for fixing, and the single-board PCB 9 (namely the above-mentioned single board 9).

The heat radiating fin with limited height and limited width 1 is connected to the effective heat-conducting rubber gasket or silicone grease 2; the effective heat-conducting rubber gasket or silicone grease 2 is connected to the boss 3;

the boss 3 needs to pass through the preset hollowed opening on PCB 4, so as to conduct the heat of the heat radiating fin with limited height and limited width to the shielding plate 2 (the heat radiating part) 6; the shielding plate 2 (the heat radiating part) 6 is connected to the heat averaging design 7 of the heat tube or the graphite film or the like, so as to fast diffuse the heat to the heat radiating part 6 of the whole shielding plate 2 through the heat averaging design 7 of the heat tube or the graphite film or the like; the shielding plate 1 (the panel portion) 5 and the shielding plate 2 (the heat radiating part) 6 are respectively fixed and assembled with the single-board PCB 9 through their own threaded holes 8 for fixing.

In the above embodiment, the heat radiating fin with limited height and limited width 1 means that the heat radiating fin of the device with a heat radiating problem is limited to height and length. At the same time, the heat radiating tooth of the heat radiating fin in the thermal design of the system is limited to density, the heat radiating fin with limited height and limited width can represent all zones with the heat radiating problem on the front of the PCB, wherein the zones are lack of convective heat radiation area.

In the above embodiment, the effective heat-conducting rubber gasket or silicone grease 2 has the heat conduction coefficient higher than 5. In a structure design, it should be ensured that the heat-conducting rubber gasket between the heat radiating fin with limited height and limited width and the boss has a certain amount of compression, so as to ensure good heat conductivity.

In the above embodiment, the boss 3 is a metal heat radiating protrusion in structure designed on the shielding plate 2 (the heat radiating part) 6. The boss is a technical means for realizing direct heat conduction from the component with the heat radiating problem on the front of the PCB to the heat radiating device with the shielding plate on the back of the PCB.

In the above embodiment, the shielding plate 1 (the panel portion) 5 is a part with the panel of two structurally or electrically separate parts into which the traditional complete shielding plate is divided. When the panel is emitted by using high-voltage static electricity, since the shielding plate 1 (the panel portion) 5 is completely isolated from the shielding plate 2 (the heat radiating part) 6, the high voltage electricity will influence, through an electric conduction part of the shielding plate 2 (the heat radiating part) 6, the working ground of the circuit which is close to the heat radiating fin with limited height and limited width 1. The structural and electrical isolation of the shielding plate is the realizing means and technical feature for ensuring the reliability of the heat radiating device with the shielding plate.

In the above embodiment, the shielding plate 2 (the heat radiating part) 6 is a main part for heat radiation of the heat radiating device with the shielding plate. Compared with the traditional shielding plate, the main part has three differences: firstly, the selection of material prefers the material of the heat radiating fin; secondly, the main part is thicker than the traditional shielding plate; thirdly, the heat averaging design of the shielding plate is made according to a simulation result.

In the above embodiment, the heat averaging design 7 of the heat tube or the graphite film or the like is the means for heat radiating design which realizes, according to a heat simulation cloud result of the single board, horizontal heat average by embedding the heat tube in the shielding plate 2 (the heat radiating part) 6 or slotting to attach the graphite film with glue. A good heat radiating effect cannot be achieved independently only depending on the boss with a limited cross section to conduct heat, and applying the heat averaging means to extend the heat from the horizontal direction and the longitudinal direction to the horizontal plane of the whole shielding plate for heat radiation is another realizing means and technical feature for ensuring the heat radiating design of the heat radiating device with the shielding plate.

In the above embodiment, the threaded hole 8 for fixing is configured to structurally fix the shielding plate 1 (the panel portion) 5 and the shielding plate 2 (the heat radiating part) 6 with the single-board PCB 9, respectively.

In the above embodiment, the single-board PCB 9 is a carrier of the component or module with the heat radiating problem and the heat radiating fin with limited height and limited width. Except opening at a special position, there is no need to perform an additional complex heat radiating design on the single-board PCB, thereby reducing the difficulty of PCB layout from the perspective of heat radiating design. Some copper areas with heat radiation holes on the back of the PCB are windowed through solder mask, and connected directly, through the heat-conducting rubber gasket, with the shielding plate for heat radiation instead of the boss, thereby realizing flexible auxiliary heat conduction.

By applying the above solution, the position of the traditional shielding plate in the system is replaced by the heat radiating device with clear components and their interconnection relationships, and distinctive technical features and design.

The above embodiments and embodiments have the following characteristics: (1) the traditional metal shielding plate serving as the mechanical support and electromagnetic shielding and playing a role of isolating air duct is abandoned, and additional heat radiating area of about 600 square centimeters in the original air duct is added to the new heat radiating device; (2) the effective heat conduction from the component with the heat radiating problem (e.g. the radiator of the optical module) to the shielding plate for heat radiation is realized through the metal boss, and the path with low heat resistance from the area with heat radiating problem to the new convective heat exchange area is formed, thereby facilitating miniaturization of the single board with high power consumption; (3) a wind resistance of the air duct is not influenced, that is because the cross section of the air duct is not reduced while the device replaces the traditional shielding plate on the original air duct; there is no need to increase the speed of a fan, thereby solving the noise problem of the system; the working difficulty of the heat radiating design of the PCB layout can be reduced, and the flexibility of the PCB layout is improved; (4) the problem of reliability caused by the connection between the traditional shielding plate connecting the protection ground and the working ground of a circuit is solved perfectly. The technology of electromagnetic shielding and heat radiation management is combined with the device.

The present invention is elaborated below in combination with the optional embodiments.

Optional embodiment 1: the heat radiating device with the shielding plate of the 100G circuit side optical module on the 100G single board with a single slot.

Figure 6:
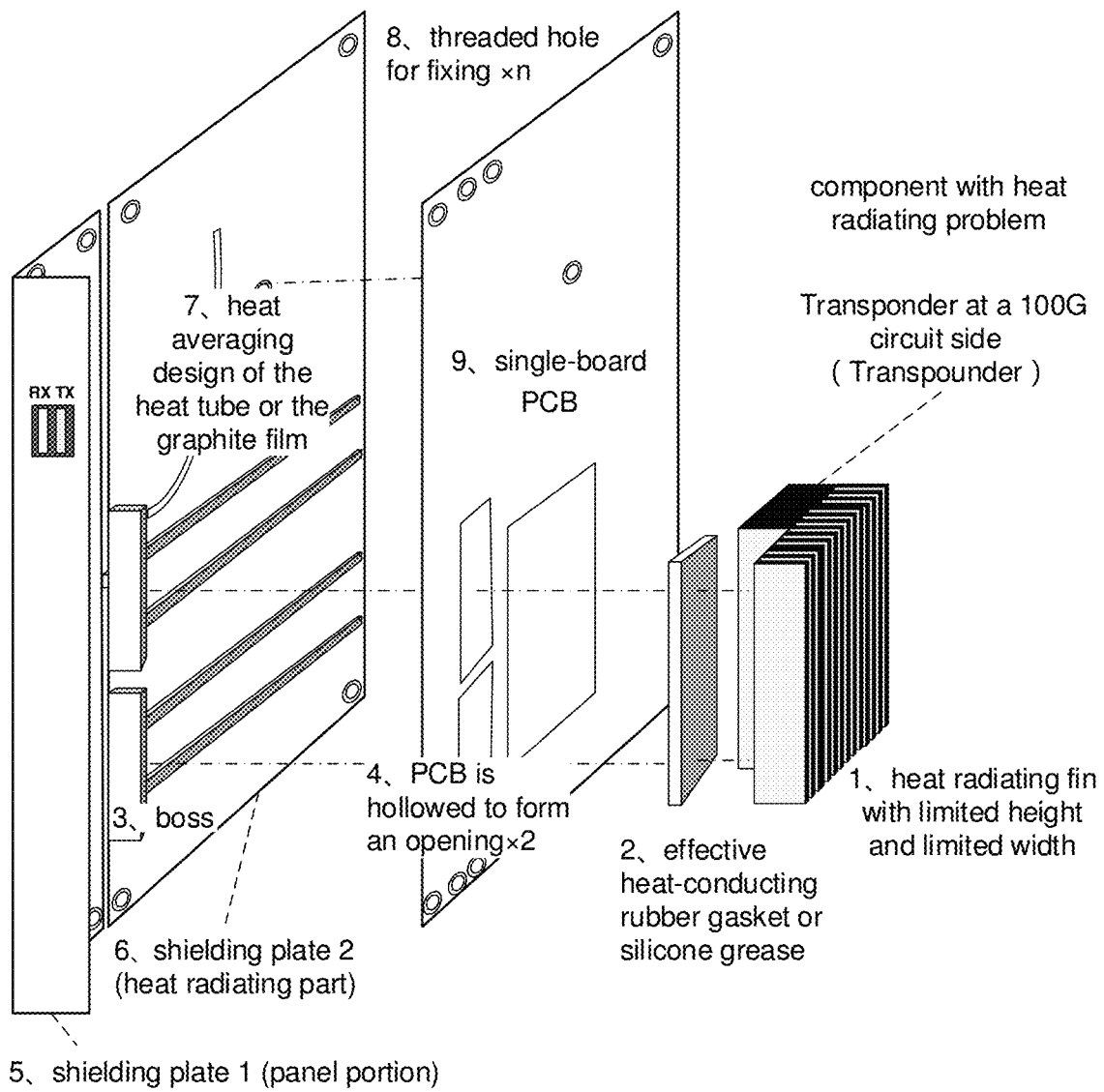
FIG. 6 is a schematic diagram of optional embodiment 1 according to the present invention.

FIG. 6 is a schematic diagram of optional embodiment 1 according to the present invention. As shown in FIG. 6, in an optical communication system, the 100G single board with a single slot enables the sub-frame with the same level to have a greater capacity, thereby enabling the device system to have strong market competitiveness. The corresponding circuit side optical module with a rate level of 100G has a larger size and higher power consumption; the single slot is equivalent to limiting the height of the heat radiating fin attached to the module. The equivalent complex heat radiating design of the components such as a service processing chip with high power consumption and a Field Programmable Gate Array (FPGA) on the board and the occupation of the PCB area and the air duct disable the optical module with high power consumption to obtain more areas of the radiating fin by expanding and hanging upside the heat radiating fin. The heat radiating problem can be solved successfully by means of the heat radiating device with the shielding plate in the optional embodiment 1. As shown in FIG. 6, the heat radiating device with the shielding plate according to the optional embodiment 1 of the present invention includes 9 components, corresponding to the numbers in FIG. 5, in the above technical features. The relationship about connection and assembling is as described in the technical solution. The heat radiating fin with limited height and limited width 1 is connected to the effective heat-conducting rubber gasket or silicone grease 2; the effective heat-conducting rubber gasket or silicone grease 2 is connected to the boss 3; the boss 3 needs to pass through the preset hollowed opening 4 of PCB, so as to conduct the heat of the heat radiating fin with limited height and limited width to the shielding plate 2 (the heat radiating part) 6; the shielding plate 2 (the heat radiating part) 6 is connected to the heat averaging design 7 of the heat tube or the graphite film or the like, so as to fast diffuse the heat to the heat radiating part 6 of the whole shielding plate 2 through the heat averaging design 7 of the heat tube or the graphite film or the like; the shielding plate 1 (the panel portion) 5 and the shielding plate 2 (the heat radiating part) 6 are respectively fixed and assembled with the single-board PCB 9 through their own threaded holes 8 for fixing.

The heat radiating fin with limited height and limited width 1 is the heat radiating fin with the heat radiating problem which is limited to height as well as length. At the same time, the heat radiating tooth of the heat radiating fin in the thermal design of the system is limited to density. According to the actual conditions, the heat radiating fin with limited height and limited width can represent all zones with the heat radiating problem on the front of the PCB, wherein the zones are lack of convective heat radiation area.

In the optional embodiment, the effective heat-conducting rubber gasket or silicone grease 2 adopts the heat-conducting rubber gasket with the heat conduction coefficient higher than 5. In a structure design, it should be ensured that the heat-conducting rubber gasket or silicone grease 2 between the heat radiating fin with limited height and limited width 1 and the boss 3 has a reasonable amount of compression and contact area, so as to ensure the good heat conduction from the heat radiating fin with limited height and limited width, which is difficult to realize convective thermal balance, to the boss.

The boss 3 is a metal heat radiating protrusion in structure designed on the shielding plate 2 (the heat radiating part) 6. In the embodiment, there are two bosses are design according to a module structure. Since the heat conduction coefficient of metal is very high, the boss passing through the board is a technical means for realizing direct heat conduction from the component with a heat radiating problem on the front of the PCB to the heat radiating device with the shielding plate on the back of the PCB.

The PCB is hollowed to form the opening 4; according to a simulation result prior to the thermal design, the opening is reserved on the PCB board; the boss attached with the heat-conducting rubber gasket contacts the radiator after passing through the opening on the PCB.

The shielding plate 1 (the panel portion) 5 is a part with the panel of two structurally or electrically separate parts into which the traditional complete shielding plate is divided. When the panel is emitted by using high-voltage static electricity, since the shielding plate 1 (the panel portion) 5 is completely isolated from the shielding plate 2 (the heat radiating part) 6, the high voltage electricity will not influence, through an electric conduction part of the shielding plate 2 (the heat radiating part) 6, the working ground of the circuit which is close to the heat radiating fin with limited height and limited width. The structural and electrical isolation of the shielding plate is the realizing means and technical feature for ensuring the reliability of the heat radiating device with the shielding plate.

The shielding plate 2 (the heat radiating part) 6 is a main part for heat radiation of the heat radiating device with the shielding plate. Compared with the traditional shielding plate, the main part has three differences: firstly, the selection of material prefers the material of the heat radiating fin; secondly, the main part is thicker than the traditional shielding plate; thirdly, the heat averaging design of the shielding plate is made according to the simulation result. The above three differences show that the traditional shielding plate is replaced by a new heat radiating device.

The heat averaging design 7 of the heat tube or the graphite film or the like is the means for thermal design which realizes, according to a heat simulation cloud result of the single board, horizontal heat average by embedding the heat tube in the shielding plate 2 (the heat radiating part) 6, thereby expanding/diffusing the heat from the horizontal direction and the longitudinal direction to the horizontal plane of the whole shielding plate for heat radiation. The device with a heat averaging design is another realizing means and technical feature for ensuring the heat radiating design of the heat radiating device with the shielding plate.

The threaded hole 8 for fixing is configured to structurally fix the shielding plate 1 (the panel portion) 5 and the shielding plate 2 (the heat radiating part) 6 with the single-board PCB 9, respectively. The number N of the threaded holes 8 is not limited and specified.

The single-board PCB 9 is a carrier of the component or module with the heat radiating problem and the heat radiating fin with limited height and limited width. In the optional embodiment, except a design requirement for opening at a special position, there is no need to perform an additional complex heat radiating design on the matched single-board PCB, thereby reducing its layout difficulty. Firstly, the single-board PCB 9 is the component in the related art, which is just used for explaining the connection and assembling relationship; secondly, except performing heat radiation to the component with problem on the front of the PCB 9, the heat radiating device with the shielding plate in the optional embodiment can also be interconnected with the cooper area with heat radiation holes on the back of the PCB and windowed through solder mask directly through the heat-conducting rubber gasket instead of the boss, thereby realizing flexible auxiliary for heat conduction and heat averaging of the single board PCB 9.

Figure 7:
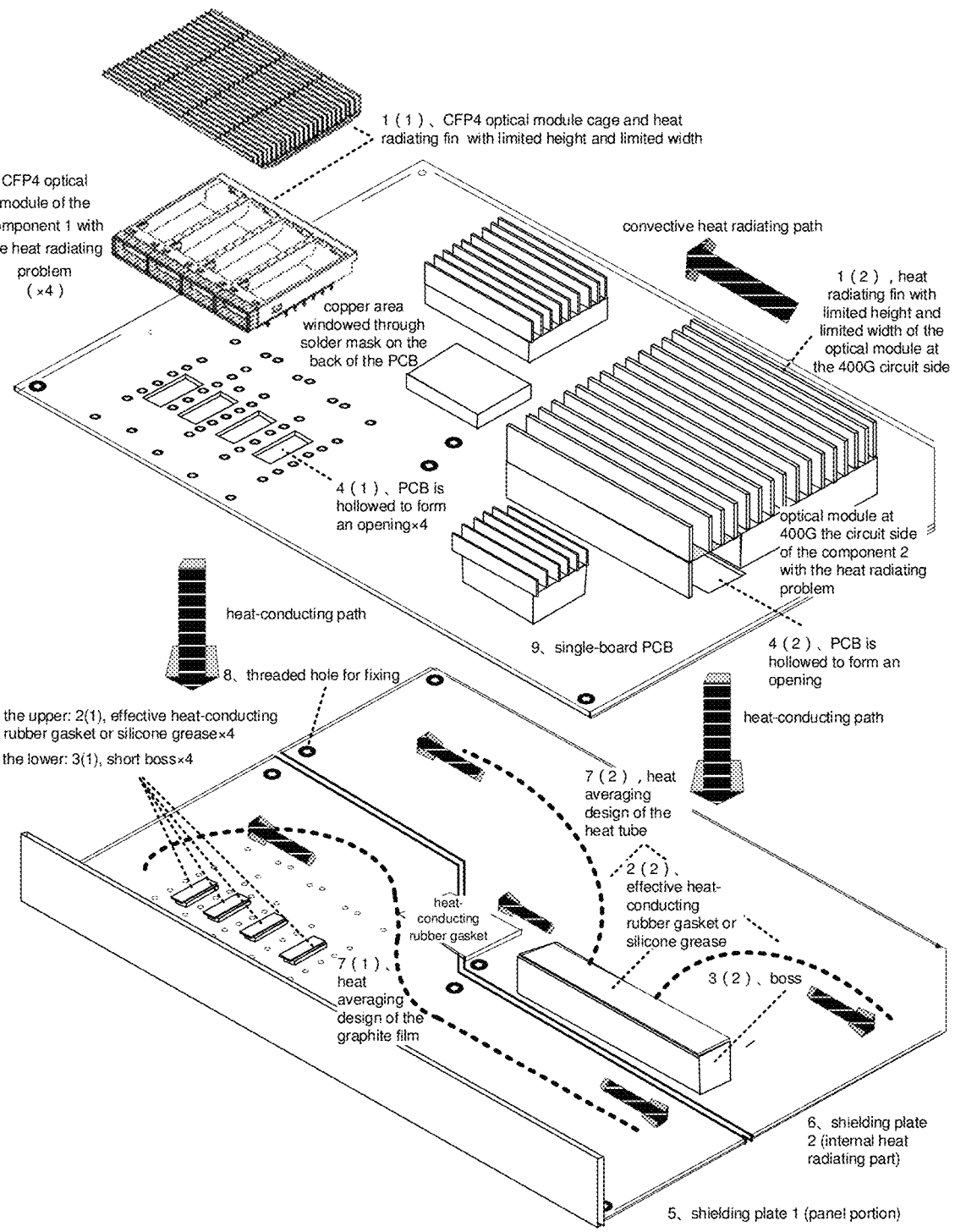
FIG. 7 is a structure diagram of optional embodiment 2 according to the present invention.

Optional embodiment 2: the heat radiating device with the shielding plate of a 400G optical forwarding board with a single slot and ultrahigh power consumption FIG. 7 is a structure diagram of optional embodiment 2 according to the present invention. As shown in FIG. 7, the heat radiating path and electrostatic leakage are included. In an optical communication system, the power consumption of the optical forwarding board, including both the optical module at a client side with the same rate level and the optical module at the circuit side, is usually highest, so that the power consumption of the 400G OTN single board including both 4 optical modules of 100 GbE CFP4 (4×100 GbE CFP4 optical modules) and the DC-DP-16QAM optical transceiver module at the circuit side is considerable. Realizing the design of single slot of the single board will have an overwhelming strong market competitiveness, but has a great design difficulty. In the optional embodiment, there are two components with heat radiating problem; a main component 1 with the heat radiating problem is 4 optical module arrays of CFP4 (4×CFP4 optical module arrays), and a main component 2 with the heat radiating problem is the DC-DP-16QAM optical transceiver module at the circuit side with a rate level of 400G; as the disadvantages of the traditional device, the single slot is equivalent to limiting the height of the heat radiating fin attached to the component with the heat radiating problem. The complex thermal design integration of the service processing chip with high power consumption and the FPGA on the board with a higher rate level and the occupation of the PCB area and the air duct cannot be completed in a traditional way. By applying the heat radiating device with the shielding plate in the embodiment, the optional embodiment can successfully solve the heat radiating problems of the main component 1 with the heat radiating problem and the main component 2 with the heat radiating problem. As shown in FIG. 7, the heat radiating device with the shielding plate according to the optional embodiment 1 of the present invention includes 9 components, corresponding to the numbers in FIG. 5, but because there are two components with heat radiating problem, individual numbers are not unique, and corner marks are added for differentiating those components.

A CFP optical module cage and the heat radiating fin 1 (1) with limited height and limited width are connected to an effective heat-conducting rubber gasket or silicone grease 2 (1); the effective heat-conducting rubber gasket or silicone grease 2 (1) is connected to a short boss 3 (1)×4; a short boss 3 (2)×4 needs to pass through a preset hollowed opening 4 (1)×4 of PCB, so as to conduct the heat of the CFP optical module cage and the heat radiating fin 1 (1) with limited height and limited width to a shielding plate 1 (a panel portion) 5; the shielding plate 1 (the panel portion) 5 is connected to a heat averaging design 7 (1) of a graphite film, so as to fast diffuse the heat to the whole shielding plate 1 (the panel portion) 5 through the heat averaging design 7 (1) of the graphite film.

The heat radiating fin 1 (2) with limited height and limited width of the optical module at the 400G circuit side is connected to the effective heat-conducting rubber gasket or silicone grease 2 (2); the effective heat-conducting rubber gasket or silicone grease 2 (2) is connected to the boss 3 (2); the boss 3 (2) needs to pass through the preset hollowed opening 4 (2) of PCB, so as to conduct the heat of the heat radiating fin 1 (2) with limited height and limited width of the optical module at the 400G circuit side to the shielding plate 2 (an internal heat radiating part) 6; the shielding plate 2 (the internal heat radiating part) 6 is connected to the heat averaging design 7 (2) of the heat tube, so as to fast diffuse the heat to the whole shielding plate 2 (the internal heat radiating part) 6 through the heat averaging design 7(2) of the heat tube.

On assembling, the shielding plate 1 (the panel portion) 5 and the shielding plate 2 (the heat radiating part) 6 are respectively fixed and assembled with the single-board PCB 9 through their own threaded holes 8 for fixing.

The heat radiating fin 1 with limited height and limited width is the heat radiating fin with the heat radiating problem which is limited to height and length. At the same time, the heat radiating tooth of the heat radiating fin in the thermal design of the system is limited to density. The heat radiating fin with limited height and limited width can also represent all zones with the heat radiating problem on the front of the PCB including the heat radiating fin. In the optional embodiment 2, that representing the main component 1 with the heat radiating problem is the heat radiating fin 1 (1) with limited height and limited width, namely the CFP optical module cage and the heat radiating fin 1 (1) with limited height and limited width. That representing the main component 2 with the heat radiating problem is the heat radiating fin 1 (2) with limited height and limited width, namely heat radiating fin 1 (2) with limited height and limited width of the optical module at the 400G circuit side.

In the embodiment, the effective heat-conducting rubber gasket or silicone grease 2 adopts the heat-conducting rubber gasket or silicone grease with the heat conduction coefficient higher than 5. In a structure design, the heat-conducting rubber gasket between the heat radiating fin with limited height and limited width and the corresponding boss should have a reasonable amount of compression, so as to ensure the good heat conduction from the heat radiating fin with limited height and limited width, which is difficult to realize convective thermal balance, to the boss. In the embodiment 2, that representing the design of the heat radiating device with the shielding plate is the effective heat-conducting rubber gasket or silicone grease ×4 2 (1); that representing a target contact component as the main component 1 with the heat radiating problem is a bottom of an integrated module cage of the CFP4 module; that representing the heat radiating fin with limited height and limited width to which the main component 2 with the heat radiating problem belongs is the effective heat-conducting rubber gasket or silicone grease 2 (2).

The boss 3 is a metal heat radiating protrusion in structure designed on the shielding plate 1 (the panel heat radiating portion) 5 and the shielding plate 2 (the internal heat radiating part) 6. Since the heat conduction coefficient of metal is very high, the boss passing through the board is the technical means for realizing direct heat conduction from the component with a heat radiating problem on the front of the PCB to the heat radiating device with the shielding plate on the back of the PCB. In the optional embodiment, the main component 1 with the heat radiating problem is the short boss ×4 3 (1), namely 4 shorter bosses. The main component 2 with the heat radiating problem is the boss 3 (2).

The hollowed opening×4 4 (1) of the PCB are four openings reserved on the PCB board for the short boss×4 3 (1) of the CFP4 module array. The size should be determined according to the actual conditions. Similarly, according to grouping of the heat radiating components, the hollowed opening of the PCB is the hollowed opening 4 (2) corresponding to the boss 3 (2).

The shielding plate 1 (the panel portion) 5 is a part with the panel of two structurally or electrically separate parts into which the traditional complete shielding plate is divided. When the panel is emitted by using high-voltage static electricity, since the shielding plate 1 (the panel heat radiating portion) 5 is completely isolated from the shielding plate 2 (the internal heat radiating part) 6, the high voltage electricity will not influence, through an electric conduction part of the shielding plate 2 (the internal heat radiating part) 6, the working ground of the circuit of the component or module which is close to the heat radiating fin with limited height and limited width of the optical module at the 400G circuit side. The structural and electrical isolation of the shielding plate is the realizing means and technical feature for ensuring the reliability of the heat radiating device with the shielding plate. In the optional embodiment 2, the difference from the optional embodiment 1 is that: the shielding plate 1 (the panel portion) 5 of the optional embodiment 2 also has a heat radiating function, the hot-plug module CFP4 has an electrostatic shield; the static electricity of the panel is removed by a loop connected to the protection ground through a module cage with a lower bonding resistance, so that the shielding plate 1 (the panel portion) 5 is flexibly amplified to perform heat radiating design.

The shielding plate 2 (the internal heat radiating part) 6 is an internal part far away from the panel in the separate shielding plate of the optional embodiment 2. In the optional embodiment 2, the part is mainly responsible for the auxiliary heat radiation of the main component 2 with the heat radiating problem.

In the optional embodiment 2, the heat averaging design 7 of the heat tube or the graphite film or the like is the means for thermal design which realizes, according to the heat simulation cloud result of the single board, horizontal heat average by considering both the heat averaging design 7 (1) of the graphite film about graphite film attached in the slot on the surface of the shielding plate 1 (the panel portion) 5 and the heat averaging design 7 (2) of the heat tube about the heat tube embedding in the shielding plate 2 (the heat radiating part) 6, based on the cost and power consumption; the means for heat radiating design fast diffuses the heat from the heat radiation boss to the horizontal plane of the shielding plate for heat radiation; the device with the heat averaging design is a realization means and technical feature for ensuring the heat radiating device with the shielding plate to be in the optional embodiment 2.

The threaded hole 8 for fixing is configured to structurally fix the shielding plate 1 (the panel portion) 5 and the shielding plate 2 (the internal heat radiating part) 6 with the single-board PCB 9, respectively. There should be threaded holes on the shielding plate 1 (the panel portion) 5, the shielding plate 2 (the internal heat radiating part) 6 and the single-board PCB 9; and the number N of threaded holes is not limited and specified.

The single-board PCB 9 is a carrier of the component or module with the heat radiating problem and the heat radiating fin with limited height and limited width. In the optional embodiment, except a design requirement for opening at a special position, there is no need to perform an additional complex heat radiating design on the matched single-board PCB, thereby reducing its layout difficulty. Firstly, the single-board PCB 9 is the component of the optional embodiment, which is just used for explaining the connection and assembling relationship; secondly, except performing heat radiation to the component with problem on the front of the PCB 9, the heat radiating device with the shielding plate in the embodiment can also be interconnected, at other additional flexible positions, as shown by the middle heat-conducting rubber gasket of the shielding plate in FIG. 7, with the cooper area with heat radiation holes on the back of the PCB and windowed through solder mask directly through the heat-conducting rubber gasket instead of the boss, thereby realizing flexible auxiliary for heat conduction and heat averaging of the PCB 9.

Obviously, those skilled in the art should appreciate that the above modules and steps of the present invention can be implemented by a general-purpose computing device, and they can be centralized in a single computing device or distributed on a network composed of multiple computing devices; alternatively, they can be implemented by a program code which is capable of being executed by the computing device, so that they can be stored in a storage device and executed by the computing device; in some cases, the presented or described steps can be performed in a sequence different from that herein, or they are made into integrated circuit modules respectively, or multiple modules and steps of them are made into a single integrated circuit module to implement. Thus, the present invention is not limited to any particular combination of hardware and software.

The above are only preferred embodiments of the present invention and not intended to limit the present invention; for those skilled in the art, the present invention may have various modifications and changes. Any modifications, equivalent replacements, improvements and the like within the spirit and principle of the present invention shall fall within the scope of protection of the present invention.

INDUSTRIAL APPLICABILITY

The present invention, relating to the field of communications, provides a heat radiating device and a heat radiating method for a single board. The device includes: a single board radiator (1), a single board (9), a first shielding plate (5) having a panel portion, and a second shielding plate (6) configured for heat radiation. A boss (3) is provided on the second shielding plate (6). The boss (3) is connected to the single board radiator (1) through an opening (4) in the single board (9), and is configured to conduct the heat collected from the single board by the single board radiator (1) to the second shielding plate (6). By means of the present invention, the problem of poor heat radiating effect in the related art, caused by a limited heat radiating area during convective heat radiation and a limited heat radiating path during conductive heat radiation, is solved, thereby achieving the effects of increased heat radiating area and increased heat radiating path.

The invention claimed is:

1. A heat radiating device for a single board, comprising:
a single board radiator,
a single board, and
a first metal shielding plate and a second metal shielding plate radiator both serving as mechanical support and electromagnetic shielding for the single board, wherein:
the first metal shielding plate has a panel portion,
the first metal shielding plate and the second metal shielding plate radiator are fixedly connected to the single board, respectively,
the second metal shielding plate radiator is also configured for heat radiation,
the second metal shielding plate radiator is structurally or electrically isolated from the first metal shielding plate,
a boss is provided on the second metal shielding plate radiator,
the boss is connected to the single board radiator through an opening in the single board, and
the boss is configured to conduct heat collected from the single board by the single board radiator to the second metal shielding plate radiator.

2. The device according to claim 1, wherein:
the boss is connected to the single board radiator through a heat-conducting component, and the heat-conducting component comprises a heat-conducting rubber gasket or silicone grease.

3. The device according to claim 1, wherein:
a heat averaging medium is set on the second metal shielding plate radiator,
the heat averaging medium is configured to diffuse the heat, which is conducted to the second metal shielding plate radiator through the boss, to the whole second metal shielding plate radiator, and
the heat averaging medium comprises a heat tube embedded in the second metal shielding plate radiator, or
the heat averaging medium comprises a graphite film attached to the second metal shielding plate radiator.

4. The device according to claim 1, wherein the first metal shielding plate and the second metal shielding plate radiator are fixedly connected to the single board through a screw hole for fixing, respectively.

5. The device according to claim 1, wherein a solder mask copper area with a heat radiating hole on a back of the single board and the second metal shielding plate radiator are interconnected through a heat-conducting rubber gasket or silicone grease.

6. A heat radiating method for a single board, comprising:
providing a first metal shielding plate and a second metal shielding plate radiator both serving as mechanical support and electromagnetic shielding for a single board, wherein:
the first metal shielding plate has a panel portion,
the second metal shielding plate radiator is also configured for heat radiation, and
a boss is provided on the second metal shielding plate radiator;
collecting, by a single board radiator, heat radiated from the single board; and
conducting, by the boss, the heat collected by the single board radiator to the second metal shielding plate radiator, wherein:
the second metal shielding plate radiator is structurally or electrically isolated from the first metal shielding plate,
the boss is connected to the single board radiator through an opening in the single board, and
the first metal shielding plate and the second metal shielding plate radiator are fixedly connected to the single board, respectively.

7. The method according to claim 6, wherein:
conducting, by the boss, the heat collected by the single board radiator to the second metal shielding plate radiator comprises conducting the heat through a heat-conducting component, and
the heat-conducting component comprises a heat-conducting rubber gasket or silicone grease.

8. The method according to claim 6, further comprising:
diffusing, by a heat averaging medium set on the second metal shielding plate radiator, the heat conducted to the second metal shielding plate radiator through the boss to the whole second metal shielding plate radiator, wherein:
the heat averaging medium comprises a heat tube embedded in the second metal shielding plate radiator, or
the heat averaging medium comprises a graphite film attached to the second metal shielding plate radiator.

9. The method according to claim 6, wherein conducting the heat, which is radiated from a heat radiating hole on a back of the single board, to the second metal shielding plate radiator in a manner of interconnecting a solder mask copper area with the heat radiating hole on the back of the single board and the second metal shielding plate radiator through a heat-conducting rubber gasket or silicone grease.

\* \* \* \* \*